United States Patent
Kawoosa et al.

(10) Patent No.: US 9,772,376 B1
(45) Date of Patent: Sep. 26, 2017

(54) INCREASE DATA TRANSFER THROUGHPUT BY ENABLING DYNAMIC JTAG TEST MODE ENTRY AND SHARING OF ALL JTAG PINS

(71) Applicant: Texas Instruments Incorporated, Dallas, TX (US)

(72) Inventors: Mudasir Shafat Kawoosa, Srinagar (IN); Rajesh Mittal, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/143,439

(22) Filed: Apr. 29, 2016

(51) Int. Cl.
| | |
|---|---|
| *G01R 31/28* | (2006.01) |
| *G01R 31/3177* | (2006.01) |
| *G01R 31/317* | (2006.01) |
| *G01R 31/3185* | (2006.01) |
| *G01R 31/319* | (2006.01) |

(52) U.S. Cl.
CPC ... *G01R 31/3177* (2013.01); *G01R 31/31701* (2013.01); *G01R 31/31723* (2013.01); *G01R 31/31926* (2013.01); *G01R 31/318572* (2013.01)

(58) Field of Classification Search
CPC ...... G06F 3/0656; G06F 3/061; G06F 3/0619; G06F 3/0685; G06F 11/1072; G11C 5/141

See application file for complete search history.

(56) References Cited

U.S. PATENT DOCUMENTS

| | | | | |
|---|---|---|---|---|
| 5,719,877 A | * | 2/1998 | Warren | G01R 31/31858 714/726 |
| 5,742,617 A | * | 4/1998 | Warren | G01R 31/318555 714/726 |
| 5,812,562 A | * | 9/1998 | Baeg | G01R 31/318552 714/726 |
| 6,629,268 B1 | * | 9/2003 | Arimilli | G06F 11/2736 711/135 |
| 7,191,372 B1 | * | 3/2007 | Jacobson | G01R 31/318555 714/724 |
| 8,140,924 B2 | * | 3/2012 | Whetsel | G01R 31/318536 714/727 |

* cited by examiner

*Primary Examiner* — Esaw Abraham
(74) *Attorney, Agent, or Firm* — Ronald O. Neerings; Charles A. Brill; Frank D. Cimino

(57) ABSTRACT

An integrated circuit with functional circuitry and testing circuitry, the testing circuitry having a state machine operable in a plurality of different states. The integrated circuit also has a pin for receiving a signal, wherein the state machine is operable to transition between states in response to a change in level of the signal. Circuitry couples the signal of the pin, in a first level, to the state machine in a first time period for causing the state machine to enter a predetermined state, and circuitry maintains the signal in the first level to the state machine in a second time period for maintaining the state machine in the predetermined state. Also during the second time period, circuitry couples data received at the pin to a destination circuit other than the state machine, wherein the destination circuit is operable to perform plural successive scan tests using data from the pin without a power on reset of the functional circuitry.

20 Claims, 6 Drawing Sheets

INCREASE DATA TRANSFER THROUGHPUT BY ENABLING DYNAMIC JTAG TEST MODE ENTRY AND SHARING OF ALL JTAG PINS

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The preferred embodiments relate to testing of integrated circuits and, more particularly, to improved test data throughput with usage of all JTAG pins.

Various techniques have been created, modified, and have evolved for testing functional cores, including logic and memories, and other circuits on an integrated circuit (IC), or multiple ICs on a printed circuit board (PCB). The older "bed of nails" testing techniques had limitations, particularly as a result of increasing larger-scales, greater complexity, and inaccessible nodes in ICs, and also in view of densely packed multilayer PCBs. As a result, contemporary testing is often more (or fully) automated and typically involves inputting data to an IC, executing one or more clock cycles on the input data, and then capturing and outputting the result, where the results can then be analyzed, such as by comparing them to an anticipated result where such comparison either thereby verifies proper operation or detects improper operation. Such testing in part arose from findings and recommendations of a Joint Test Action Group (JTAG) formed of various silicon manufacturers, which were then used as a basis for the IEEE standard 1149.1 and subsequent versions thereof. With this standard and these developments, many contemporaries ICs include some level of embedded circuitry and an input/output interface to facilitate testing. Under 1149.1, also referred to as JTAG given its origination, four or five pins are included on an IC, each corresponding to a respective dedicated test access port (TAP) signal for testing interconnects on either the IC or a PCB into which the IC is assembled. Specifically, the TAP signals may be used to determine whether an IC is properly functioning, whether it is connected to the PCB, and also for debugging by observing IC pin states or measured voltages. Testing may be achieved at the time of manufacture, such as by automated testing equipment (ATE), as well as subsequent testing in the field (e.g., once a device has been sold or located in the marketplace). Additional details are specified in IEEE 1149 and its .x sub-standards.

By way of further background, FIG. 1 illustrates an electrical block diagram of an IC 10 having a JTAG architecture according to the prior art, and which further includes boundary scanning, although certain designs may include JTAG without boundary scanning. For purposes of simplification, IC 10 is shown to include a test access port TAP controller 12 for interfacing with TAP signals and as relating to JTAG testing. IC 10 also includes functional circuitry 14, sometimes referred to as a core, which is a general depiction of the various circuit functions of IC 10 including ALU, processing circuitry, logic, memories and the like, apart from JTAG testing. IC 10 also includes a number of I/O pins (sometimes also called pads) $P_0$ through $P_{15}$, shown at various locations around the perimeter of the device. Pins $P_0$ through $P_4$ carry respective and known JTAG TAP related signals, as shown in the following Table 1.

TABLE 1

| Pin | JTAG Signal | Function |
|---|---|---|
| $P_0$ | TDO | test data out |
| $P_1$ | TRST | test reset |
| $P_2$ | TMS | test mode select |
| $P_3$ | TCK | test clock |
| $P_4$ | TDI | test data in |

As indicated in Table 1, pin $P_4$ allows input of JTAG test data and pin $P_0$ allows output thereof, while the remaining pins $P_1$ through $P_3$ provide respective signals to TAP controller 12. An instruction register 16 stores a current JTAG instruction, typically to indicate the operation to take with respect to signals that are received (e.g., defining to which data register signals should pass). A bypass register 18 is a single bit register that permits TDI to bypass a boundary scan chain of individual serially connected registers, typically comprising one or more flip flops, referred to herein as cells $C_0$ through $C_{15}$, so as to pass directly from input to output. An ID register 20 is for storing the ID code and revision number for IC 10, thereby allowing IC 10 to be linked to a file that stores boundary scan configuration information for IC 10.

Apart from the JTAG-related pins $P_0$ through $P_4$, each of the remaining IC pins $P_5$ through $P_{15}$ is connected to respective boundary scan cell $C_5$ through $C_{15}$, where each such cell can transfer data in two manners, the first being able to pass cell data received from its respective pin, through the cell, to functional circuitry 14; and the second being along the chain of cells $C_5$ through $C_{15}$. Thus, in the first manner of data transfer, such pins represent the bidirectional I/O of IC 10, in connection with its intended operation as achieved by functional circuitry 14, in which case the cells are effectively transparent. In the second manner of data transfer, however, which also is in connection with JTAG testing, each of scan cells $C_5$ through $C_{15}$ is connected to at least one other scan cell and is operable to shift data from itself to that connected cell, thereby forming a boundary scan chain whereby for JTAG purposes data may be input by a respective pin to each cell, or captured in each cell from functional circuitry 14, and then such data may be successively shifted along the chain in a direction from lower numbered toward higher numbered cells, so that test data ultimately is output from the last such cell $C_{15}$ as TDO information. In this manner, therefore, the I/O connectivity as well as data states from functional circuitry 14 may be evaluated so as to confirm proper operation of IC 10.

Scan testing is not limited to boundary scans using JTAG. Some ICs include additional and non-boundary or internal chains of cells (registers) sometimes referred to as stumps (or STUMPS—self-testing using MISR [multiple input signature register] and parallel SRSG [shift register sequence generator]). In this context, data is input to the IC across numerous pins and then distributed to the one or more internal scan chains, where again one or more execution cycles are performed and then the results are captured into the scan chain(s) and output from the device. To accomplish such testing, typically the input test data may involve relatively large quantities representing considerable testing time and other resources, so these test sets may be reduced and input to the IC, then decompressed into a larger data set for testing; moreover, after the test execution cycle(s), the result is then compressed prior to outputting the counterpart result data. While such an approach has various benefits, it also is limited, for example, in ICs having a relatively low pin count, as the reduced number of pins constrains the amount of test data that may be input to the IC, or output from the IC, at a time. Additional prior art approaches, therefore, have arisen to address these constraints, but they typically still present some penalty in terms of test time. Moreover, some such approaches are only suitable where the number of scan inputs required is very high, whereas for many modern ICs this requirement may not be the case, or the needs given the IC and testing requirements could be better addressed with other approaches, were such approaches available in the art.

Also in the prior art certain JTAG pins are sometimes used for purposes other than JTAG data or JTAG TAP control. For example, in one prior art approach, the TMS pin may be used first as a control to the tap controller 12 so as to place the JTAG finite state machine (FSM) into one of its 16 states, namely, the Run-Test/Idle state, wherein the FSM either remains idle or, upon reaching the state the TMS pin is released while a scan test is then performed. In this approach, however, once the test is complete, if an alternative test is desired, the formerly released TMS pin is no longer available for controlling the TAP controller FSM; instead, under the prior art, a power-on-reset (PoR) is required, which typically defines a time that at least some functional portion of the IC is placed in a reset state, as may be defined for example by the RC constant of a resistor and capacitor. In any event, during this reset state, at least portions of the IC functionality are not operable for input/output and other operation, while instead the supply voltage is allowed sufficient time, and the rest of the states of the device are restored, to a known start-up state. Thus, for each such repeated instance of the released TMS pin followed by a test and a PoR, then valuable time is consumed and thereby added to the overall testing time, for each successive PoR event. Indeed, in contemporary devices, a PoR cycle can result in an overhead of 100 ms per PoR event, so multiple successive releases of the TMS pin considerably add to test time. As an alternative, the TMS pin may be reserved at all times solely to provide control to the TAP controller, but such an approach therefore eliminates the TMS pin as a candidate for providing test data, in which case there is considerably greater overhead in reducing the amount of test data that can be input to the IC, without the use of this pin.

Given the preceding, the prior art poses various complexities and drawbacks, and the preferred embodiments provide a favorable alternative, as further detailed below.

BRIEF SUMMARY OF THE INVENTION

In a preferred embodiment, there is an integrated circuit, comprising functional circuitry and testing circuitry, the testing circuitry comprising a state machine operable in a plurality of different states. The integrated circuit also comprises a pin for receiving a signal, wherein the state machine is operable to transition between states in response to a change in level of the signal. The integrated circuit also comprises circuitry for coupling the signal, in a first level, from the pin to the state machine in a first time period for causing the state machine to enter a predetermined state. The integrated circuit also comprises circuitry for maintaining the signal in the first level to the state machine in a second time period for maintaining the state machine in the predetermined state. The integrated circuit also comprises circuitry for coupling data received at the pin, during the second time period, to a destination circuit other than the state machine, wherein the destination circuit is operable to perform plural successive scan tests using data from the pin without a power on reset of the functional circuitry.

Numerous other inventive aspects and preferred embodiments are also disclosed and claimed.

DETAILED DESCRIPTION OF EMBODIMENTS

Figure 1:
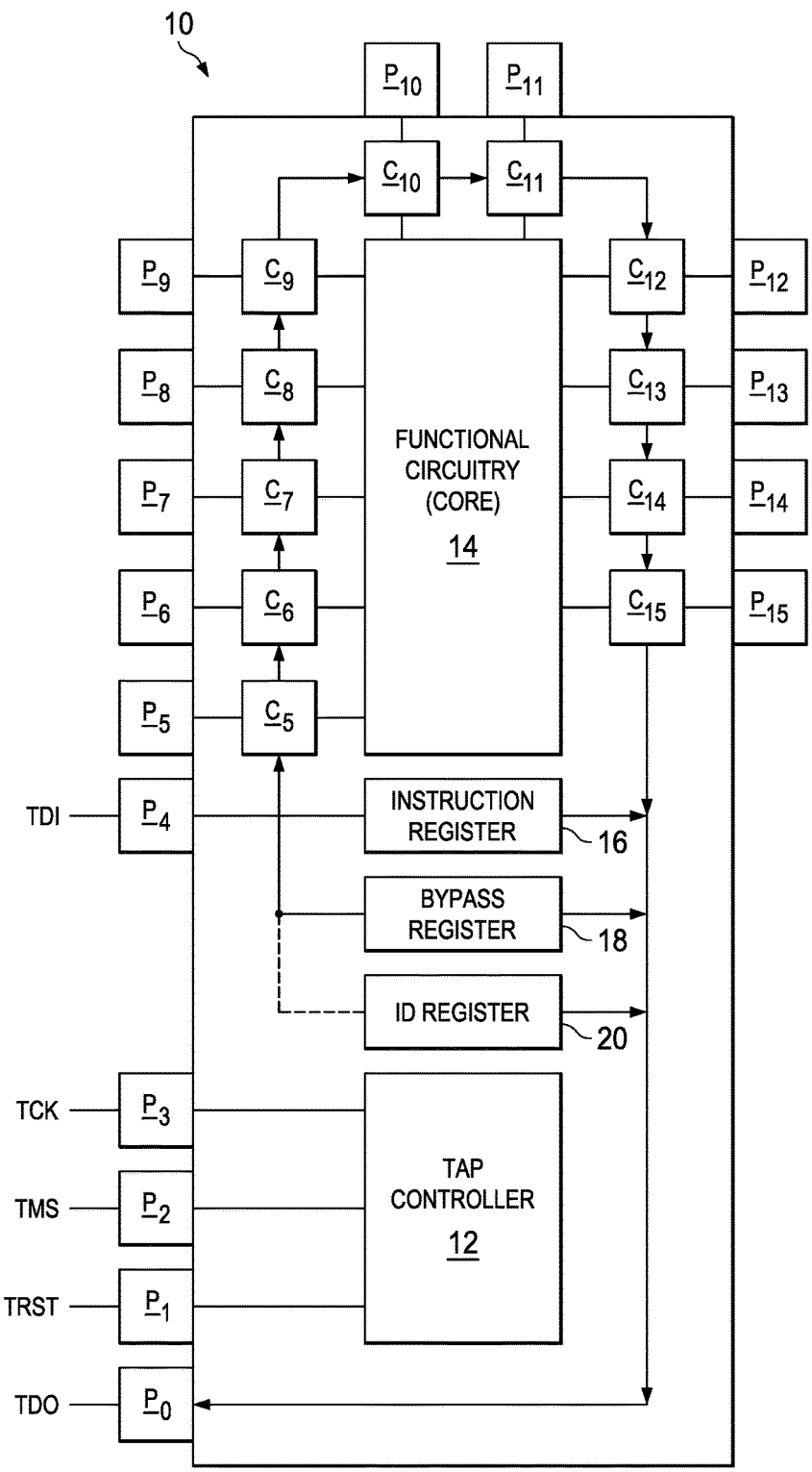
FIG. 1 illustrates an electrical block diagram of an IC 10 having a boundary scan architecture according to the prior art.

FIG. 1 was described in the above background of the Invention section of this document, and the reader is assumed familiar with that discussion.

Figure 2:
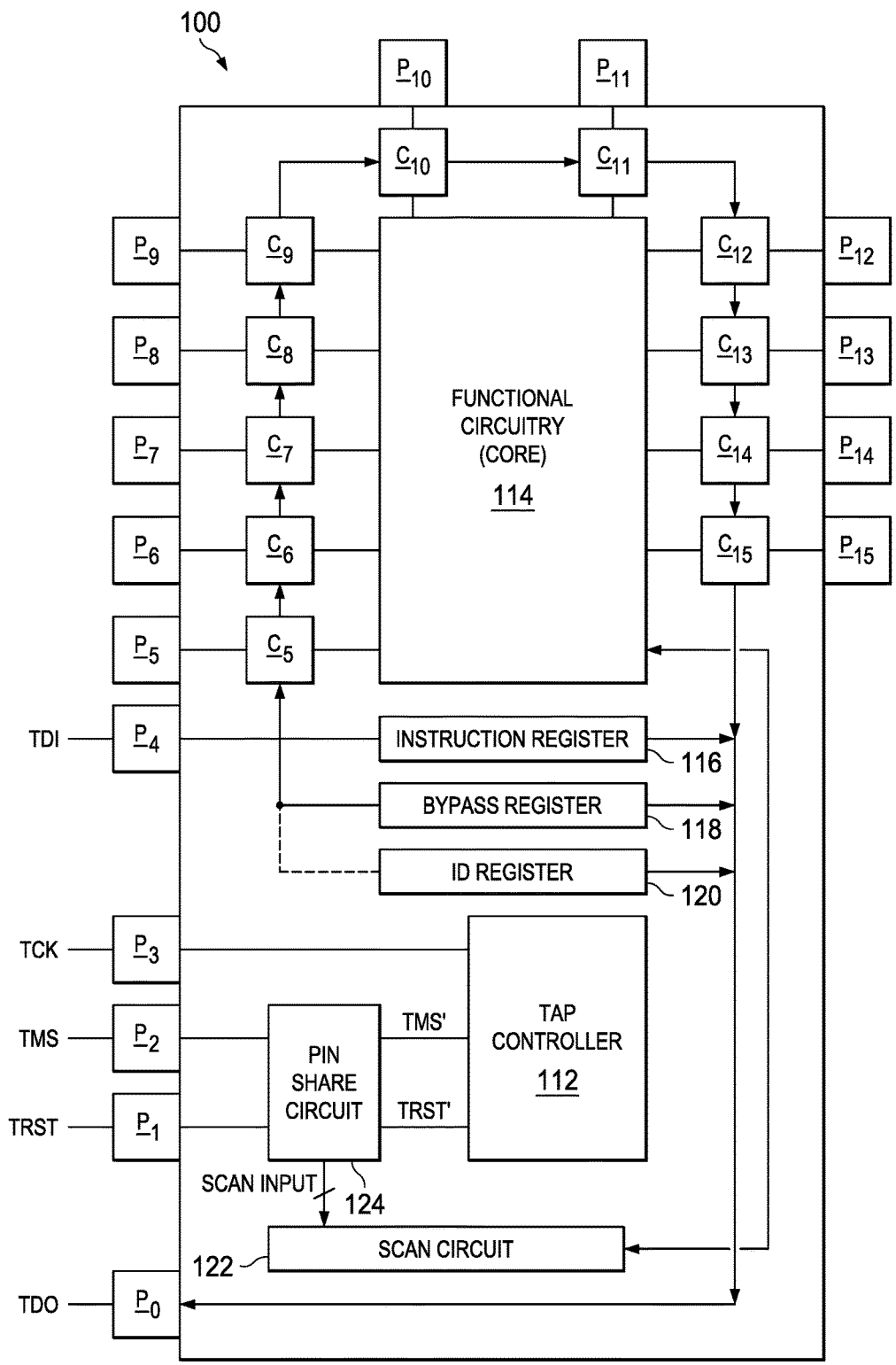
FIG. 2 illustrates an electrical block diagram of an IC 100 according to a preferred embodiment.

FIG. 2 illustrates an electrical block diagram of an IC 100 according to a preferred embodiment. By way of introduction, IC 100 includes various functional blocks comparable to those described earlier in connection with FIG. 1, where, for sake of ease in understanding, those blocks in FIG. 2 are numbered by adding 100 to the reference number of FIG. 1. Thus, in connection with processing JTAG signals and IC functionality, IC 100 includes a TAP controller 112, functional circuitry (or core) 114, an instruction register 116, a bypass register 118, and an ID register 120, each of which in general is known in the art, with the exception of additional aspects relating in part to the preferred embodiment additions, described below.

IC 100 also includes a scan circuit 122. Scan circuit 122 represents additional circuitry embedded in the IC for testing beyond the boundary testing available via the scan chain register consisting of cells $C_5$ through $C_{15}$. For example, scan circuit 122 may include one or more additional scan chains, where each such chain comprises a number of cells (e.g., flip flops) into which data may be shifted, with such data then executed via functional circuitry 114 (including logic, memories, or other functions therein), and then the result stored back into respective cells and shifted out, either onboard of IC 100 or externally, for analysis as to whether the result represents proper operation of the tested functional circuitry. Further in this regard, scan circuit 122 may include decompression circuitry for decompressing input test data (sometimes referred to as test vectors) and then writing the decompressed input test data to a scan chain, and likewise compression circuitry for compressing output test data that results in each scan chain after the test execution cycle(s), where the compressed data is then output for analysis. Other on-board testing circuitry also may be included by one skilled in the art in scan circuit 122. In any event, however, and of note with respect to the preferred embodiment, scan circuit 122 may receive inputs that correspond to one or both of the JTAG TMS and TRST signals, that is, test data may be provided for such scan testing via either or both of pins $P_1$ and $P_2$. Further in this regard, IC 100 also includes a pin share circuit 124, which is connected to pins $P_1$ and $P_2$, for receiving the JTAG TMS and TRST signals, respectively. As further detailed below, pin share circuit 124 can pass through either or both of the TMS and TRST signals to scan circuit 122, thereby allowing those signals during certain periods to provide test data for scan testing, while at the same time scan circuit 122 also provides JTAG counterpart signals, shown as TMS' and TRST', to TAP controller 112, which are received and processed in lieu of the actual TMS and TRST signals, that is, the states of these TMS' and TRST' counterpart signals provide JTAG compliance (e.g., with IEEE 1194.1) as received by the JTAG state machine, while at the same time the JTAG TMS and TRST pins may input test data to scan circuit 120. Lastly, note that various other of the pins on IC 100 also may provide test data to scan circuit 120 as is known in the art, but such connections are neither shown nor detailed so as to simplify and focus the discussion to preferred embodiment aspects relating to the TMS and TRST signals, and the pins corresponding to those signals.

Figure 3:
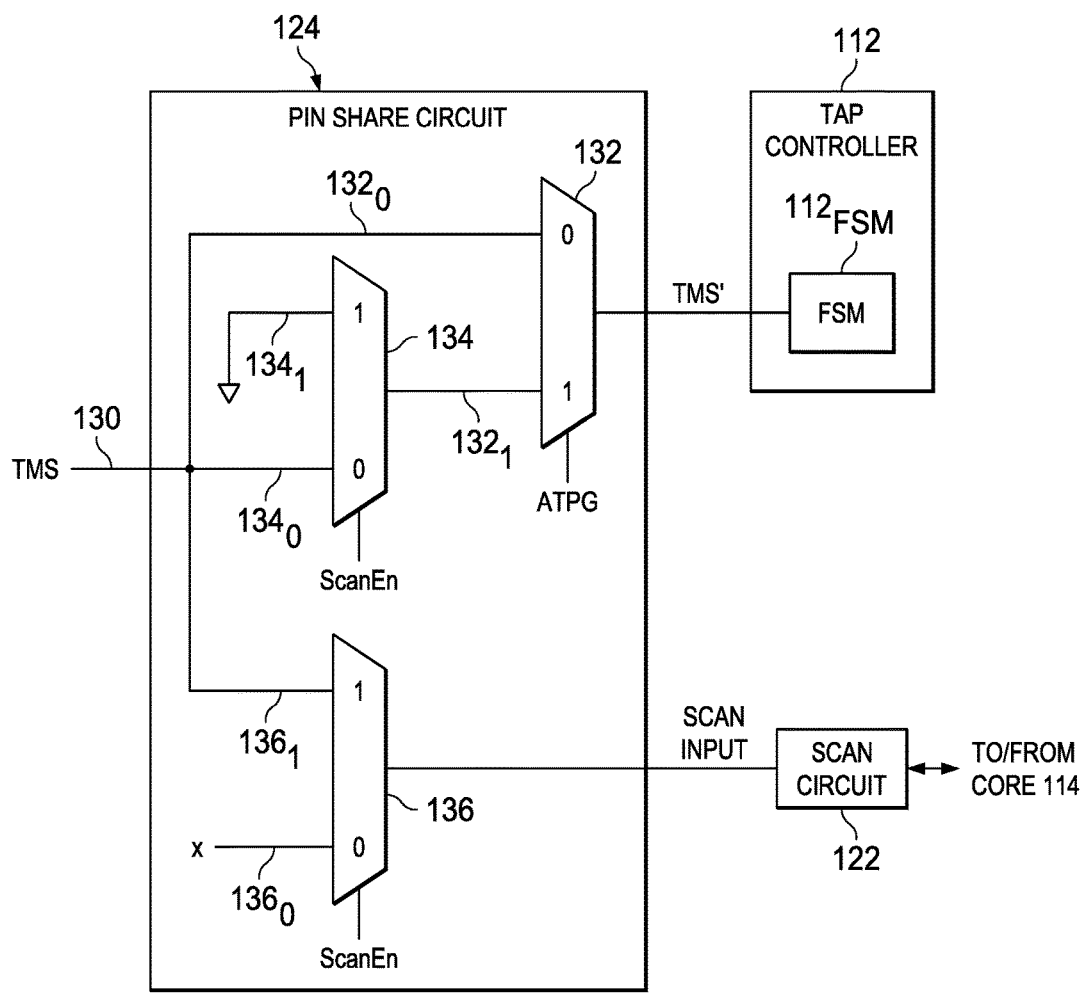
FIG. 3 illustrates an electrical block diagram of a pin share circuit for allowing the TMS pin to be shared for finite state machine and scan circuit data.

FIG. 3 illustrates greater detail in an electrical block diagram of pin share circuit 124 from FIG. 2, in connection with the TMS signal. The TMS signal is connected to an input 130. Input 130 is connected to an input $132_0$ of a multiplexer 132, an input $134_0$ of a multiplexer 134, and an $136_1$ of a multiplexer 136—note that for these multiplexers, as well as others described in this document, the subscript on an input is the state of the control signal that will select the corresponding input. For example, for multiplexer 132, it is controlled by an automatic test pattern generation (ATPG) signal, whereby if ATPG=0, then input $132_0$ of multiplexer 132 is selected for output by the multiplexer, whereas if ATPG=1, then input $132_1$ of multiplexer 132 is selected for output by the multiplexer. The remaining connections to multiplexers 132, 134, and 136 are now described. An input $132_1$ of multiplexer 132 is connected to the output of multiplexer 134, and the output of multiplexer 132 provides the TMS' signal to TAP controller 112 and, more particularly, to the finite state machine (FSM) $112_{FSM}$ of the controller. The input $134_1$ of multiplexer 134 is connected to ground, and the control signal for multiplexer 134 is a ScanEn (i.e., scan enable) signal, which may be provided either internally or externally with respect to IC 100, and ScanEn is enabled during certain testing steps, as further described later. The control signal for multiplexer 136 is also the ScanEn signal, and the output of multiplexer 136 is connected to provide the TMS data from pin 130 onward to scan circuit 122. The input $136_0$ of multiplexer 136 is shown as receiving a logical "don't care" signal (shown as x), for in this embodiment when ScanEn=0, any information provided to scan circuit 122 is not relevant, as scanning in that circuit during that time is not occurring.

Figure 4:
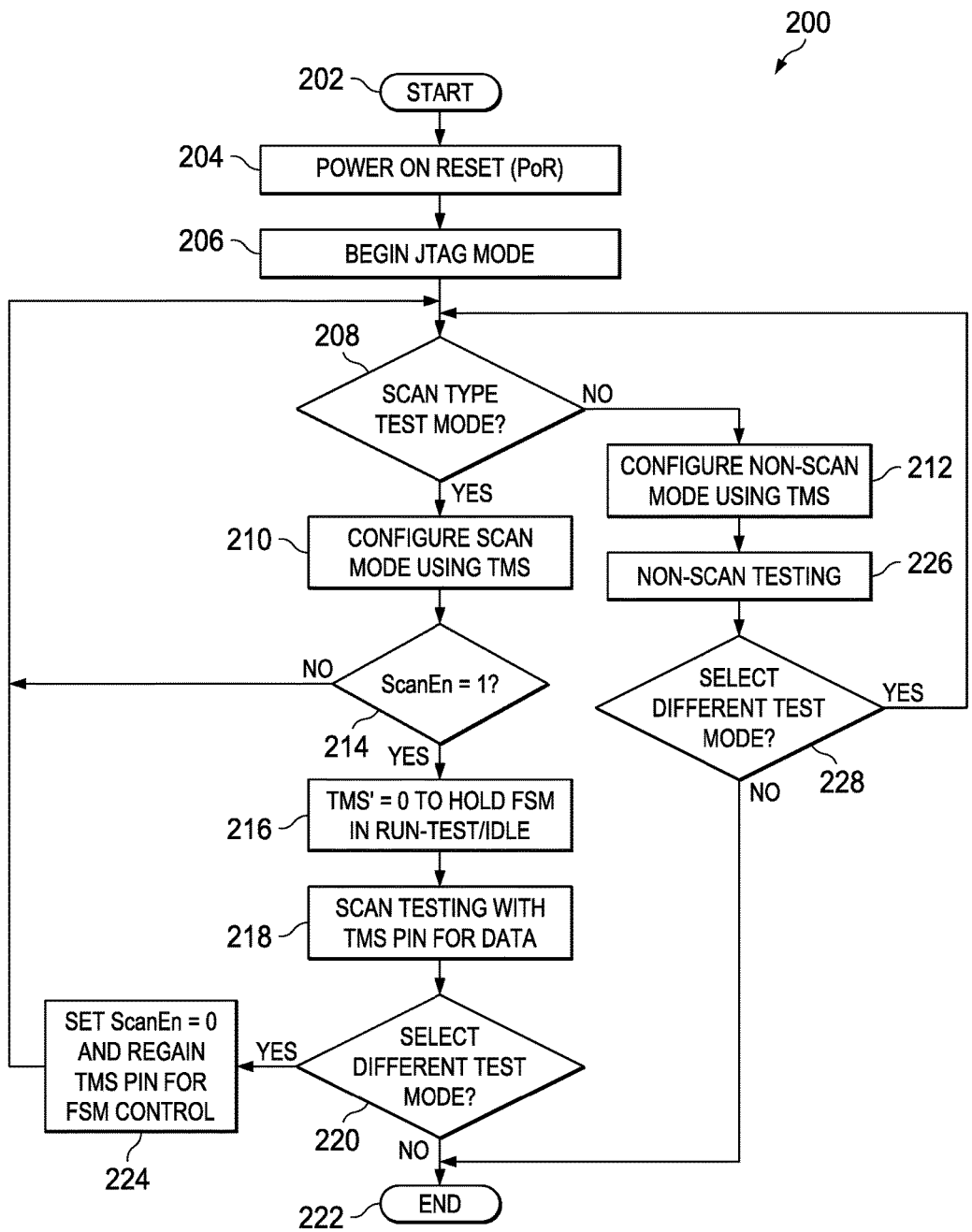
FIG. 4 illustrates a flowchart of a preferred embodiment method of operation of the pin share circuit of FIG. 3.

The operation of pin share circuit 124 of FIG. 3 is now described in connection with a method 200 of operation shown by way of a flowchart in FIG. 4. Method 200 is shown to begin with a start step 202, followed by a PoR step 204, such as may occur when IC 100 is first enabled. Following PoR step 204, IC 100 begins a JTAG mode step 206, if commenced such as by various techniques known in the art. For example, in devices having dedicated JTAG pins, one manner of entering JTAG mode is holding TMS high and pulsing TCK five times. As another example, in devices having some shared JTAG pins, the device may include an additional pin (e.g., a TEST) pin that may be asserted in a manner so as to enter step 206. In any event, following step 206 is a step 208, which determines whether the JTAG mode is to perform a scan type test, as may indicated by an additional bit or bits in the programmable core data register. If step 208 is answered in the affirmative, method 200 continues to step 210, whereas if step 208 is answered in the negative, method 200 continues to step 212.

In step 210, a TMS signal of 0 configures the type of scan mode, that is, from the known JTAG state machine, an update of the Data/Instruction register with a value of TMS=0 configures the FSM to the run test idle state of the scan mode. Also during step 210, ATPG mode is asserted.

Step 214 represents a preferred embodiment additional step that, as will be shown, facilitates the use of the TMS pin (e.g., pin $P_2$ in FIG. 2) to be shared, that is, in some instances to control the TAP controller FSM and in others to be used for providing scan data, where additional selectivity as between these two options is accomplished by an additional signal, which in a preferred embodiment is the ScanEn signal. Specifically, in the preferred embodiment, when it is desired during testing to share the TMS pin to provide scan data, then ScanEn is set to one, or is used as already set to one given the nature of the intended testing mode, as a control in pin share circuit 124 so as to allow this result. In contrast, when the state at the TMS pin is to govern FSM $112_{FSM}$, then ScanEn is set to zero. Thus, step 214 represents a conditional step to evaluate the value of ScanEn, which based on the two options listed above, directs control accordingly. Thus, if ScanEn=1, method 200 continues from step 214 to step 216, whereas if Scan=0, method 200 returns from step 214 to step 208.

In step 216, having been reached because ScanEn=1, pin share circuit 124 of FIG. 2 operates to provide a signal TMS', thereby maintaining the immediately-preceding signal value from the value of TMS at pin $P_2$, to hold FSM $112_{FSM}$ in its Run-Idle/Test state, while concurrently allowing the value(s) of TMS at pin $P_2$ to be directed to a destination on IC 200 other than the FSM, that is, so that pin $P_2$ can provide data during this time for some other purpose, such as for scan data. Specifically, returning to FIG. 3, with ScanEn=1, then multiplexer 134 selects the ground (i.e., logical 0) at its input $134_1$, and outputs that logical 0 to input $132_1$ of multiplexer 132; further, because ATPG=1 (as already established above), this same logical 0 is output by multiplexer 132 as the TMS' signal to the TAP controller FSM $112_{FSM}$. As a result of this connection, the tied value of ground is presented to TAP controller FSM $112_{FSM}$ so as to match the low level that was immediately prior provided from pin $P_2$, and thus while the signal level is maintained at that value, and according to the IEEE specification for a JTAG stage machine, then a low value received by the TAP controller FSM $112_{FSM}$ during the Run-Test/Idle state thereby maintains it in that Run-Test/Idle state.

Method 200 is shown to continue from step 216 to step 218. Recall that step 216 during this time is connecting the tied value of logical 0 to TAP controller FSM $112_{FSM}$ and thereby maintaining it in the Run-Test/Idle state, while at the same time in step 218 this separate tied value thereby releases the TMS input at pin $P_2$ to be free for some other purpose, as it is then not needed to communicate the logical 0 to the state machine; in a preferred embodiment, therefore, during this release period the TMS input at pin $P_2$ is provided to another destination other than the FSM, and preferably is usable to provide scan test data for IC 100. In this regard and again looking to FIG. 3, recall that the TMS input at pin $P_2$ is connected to input $136_1$ of multiplexer 136.

Moreover, because ScanEn=1 (see step 214), then input $136_1$ of multiplexer 136 passes the data from the TMS input at pin $P_2$ to scan circuit 122. Thus, such data may be used as test data, such as in addition to test data then being input from other pins (including other JTAG pins) of IC 100. In this regard, therefore, additional data bandwidth is provided from pin $P_2$ during the step 218 scan testing, as compared to a scenario where the additional usage of pin $P_2$ for data is not available. Such scan testing can then continue until desirably concluded, at which point method 200 continues from step 218 to step 220.

Step 220 determines whether a different test mode is desired. For example, various test modes that could apply to the determination in step 220 (and step 208) include PBIST, DC Parametric Tests, Flash Test, eFuse Test, Boundary Scan Test, and others known to or ascertainable by one skilled in the art. If a different test mode is not desired, method 200 continues to an end step 222, thereby terminating the method flow. If, to the contrary, a different test mode is desired, then method 200 continues from step 220 to step 224.

Step 224 returns ScanEn back to a value of 0, where recall earlier that ScanEn was equal to a value of 1 as of step 214, which advanced the flow to other steps preceding step 224. Returning to FIG. 3, note that with ScanEn=0, multiplexer 134 selects its input $134_0$, which is the TMS data from pin $P_2$, and that data is output to multiplexer 132. Further with respect to multiplexer 132, because ATPG remains at 1, multiplexer 132 outputs the TMS data, as the signal shown as TMS', to FSM $112_{FSM}$. Thus, in step 224, the TMS pin $P_2$ is regained for serving to provide control to the TAP controller FSM, rather than serving to provide additional test data as was the case in step 218.

Following step 224, method 200 returns to step 208, where the function of that step repeats as described above. Note, therefore, that with a first pass through steps 210 through 224, a first scan type test may be performed, using the TMS pin ($P_2$) for transferring additional test data, and then the flow may return again to step 208 for a second or other subsequent pass through those steps, in which case the TMS pin ($P_2$) again may be used for transferring additional test data. For each set of steps consisting of a pass through steps 210 through 224, therefore, additional test data bandwidth is facilitated using the TMS pin, and also of important note that each successive scan type test may be performed in this manner without requiring a PoR of IC 100. In contrast, the prior art, where it was desirous to dual share a TMS pin for FMS control and scan test data, requires such a PoR, thereby disrupting the provision of power and/or a clocking signal to certain functional parts of the integrated circuit and increasing overall test time. The preferred embodiments, therefore, instead allow a dynamic return of the TMS pin to its FSM control functionality, without requiring a reboot or other PoR event of the integrated circuit.

Completing method 200, recall in step 208 that if a scan type test mode is not desired, method 200 continues to step 212, where non-scan test mode can occur, such as memory test (through PBIST), DMLED, I/O, EFUSE, etc. Thus, step 212 configures the non-scan test mode according to the test to be achieved, and step 226 then performs that test. Thereafter, step 228 operates in the same manner as step 220, that is, it determines whether a different test mode is desired in which case method 200 returns to step 208 or, if not, then method 200 concludes at step 222.

Also completing the operation of FIG. 3, note that the structure therein also facilitates the desired connectivity when the ATPG mode is not asserted (i.e., when ATPG=0). In this case, multiplexer 132 selects and outputs the data at its input $132_0$, thereby connecting the TMS data at pin $P_2$ through, and indicated as TMS', to FSM $112_{FSM}$. Thus, when ATPG=0, the TMS signal is connected as a control to the TAP controller FSM.

Figure 5:
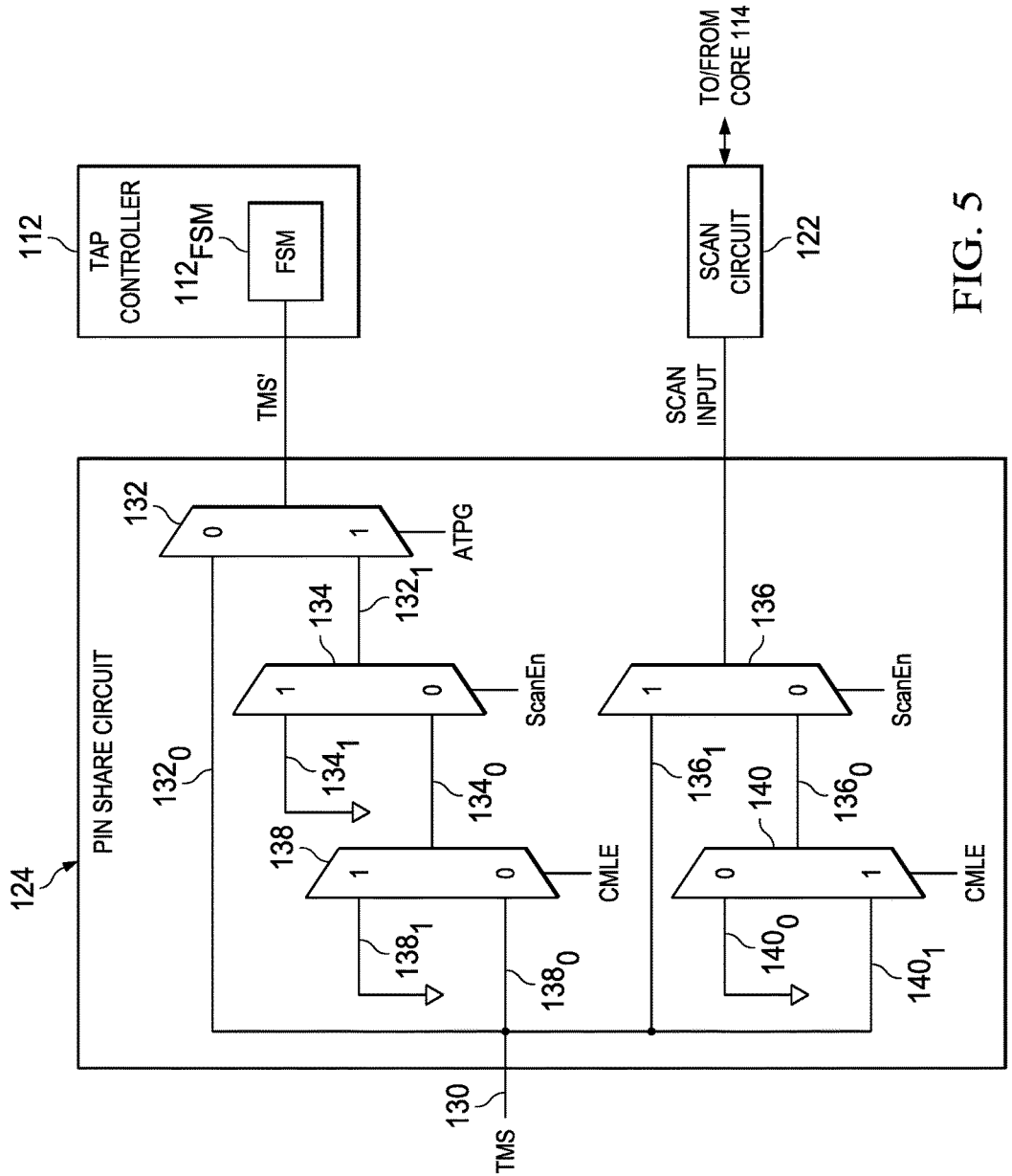
FIG. 5 illustrates an electrical block diagram of an alternative preferred embodiment pin share circuit for allowing the TMS pin to be shared for finite state machine and scan circuit data.

An alternative preferred embodiment further enhances the preceding by extending it to an architecture that implements Channel Mask Load Enable (CLME), such as in a Cadence scan architecture where the CMLE also controls the TAP FSM. Such an approach is shown in FIG. 5, which is comparable to FIG. 3 and thus, like reference numbers are used in both Figures for like elements. The FIG. 5 preferred embodiment, however, includes an additional two multiplexers 138 and 140, both having CMLE as a control input and connected as now further described. Multiplexer 138 is connected to receive the TMS pin data at its input $138_0$, its input $138_1$ is connected to ground, and its output is connected to input $134_0$ of multiplexer 134. Multiplexer 140 is connected to receive the TMS pin data at its input $140_k$, its input $140_0$ is connected to ground, and its output is connected to input $136_0$ of multiplexer 136.

The operation of pin share circuit 124 of FIG. 5 should be readily understood by expanding on the already-described operation of pin share circuit 124 of FIG. 3, and given the following. During non-ATPG mode, ATPG=0 in which case multiplexer 132 selects its input $132_0$, thereby connecting the TMS input (e.g., from pin $P_2$) directly to FSM $112_{FSM}$. When ATPG mode is set (i.e., ATPG=1), either the ScanEn or CMLE mode may be set, in which case ultimately multiplexer 134 will provide a directly tied value of 0 as the TSM signal (shown as TSM') to FSM $112_{FSM}$. Thus, where ATPG=1 and CMLE=1, then ScanEn=0 and multiplexer 138 connects a value of ground from input $138_1$ to input $134_0$, and multiplexer 134 passes that value to input $132_1$ of multiplexer 132, which connects the ground (i.e., digital 0) to FSM $112_{FSM}$, thereby maintaining the FSM in a Run-Test/Idle state At the same time, multiplexer 140 connects the TMS data at its input $140_1$ to input $136_0$ of multiplexer 136, and multiplexer 136 passes that data through to scan circuit 122. Or, where ATPG=1 and ScanEn=1, then CMLE=0 and multiplexer 134 connects a value of ground from input $134_1$ to input $132_1$ of multiplexer 132, which connects the ground (i.e., digital 0) to FSM $112_{FSM}$, thereby maintaining the FSM in a Run-Test/Idle state. At the same time, multiplexer 136 connects the TMS data at its input $136_1$ to scan circuit 122. Given the preceding, therefore, for either ScanEn or CMLE enabled, the FSM is maintained in its Run-Test/Idle state, while the TMS pin is able to provide additional test data to scan circuit 122.

Figure 6:
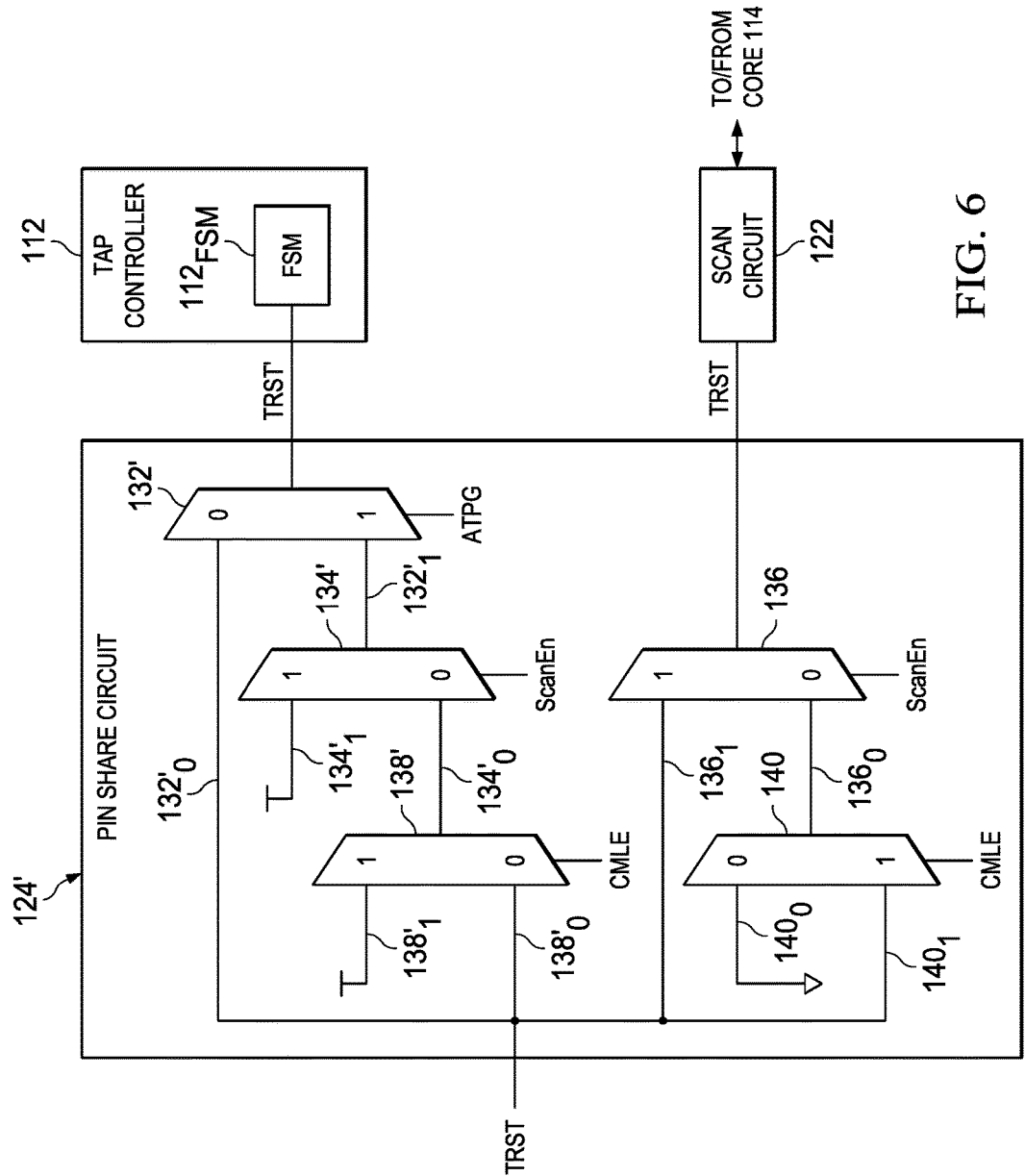
FIG. 6 illustrates an electrical block diagram of an alternative preferred embodiment pin share circuit for allowing the TRST pin to be shared for finite state machine and scan circuit data.

Recall that FIG. 2 illustrates that the pin share circuit 124 may communicate either the RMS or TRST signals to scan circuit 122, with signals TMS' and TRST' provided to tap controller 112. In regard to the TRST signal, therefore, FIG. 6 illustrates an alternative preferred embodiment pin share circuit 124', which can be used in lieu of, or by combining its aspects with, preferred embodiments illustrating a pin share circuit 124 described earlier, and in connection with the TRST signal. In FIG. 6, therefore, the signal input and multiplexer path relates to the JTAG TRST signal, rather than the TMS signal. Recall in this regard that the TRST signal was shown and described in connection with pin $P_1$ in FIG. 2. Moreover, as known in the art, the TRST signal is such that a value of 0 resets the FSM, while a value of 1 will not change the state of the FSM. Thus, in the prior art, a separate TRST pin is sometimes used and that pin is therefore occupied and unavailable for an alternative use when it is asserting a value of 1, so as not to change the state of the FSM. In the preferred embodiment however and in contrast to the prior art, pin share circuit 124' includes mutliplexers comparable to multiplexers 134 and 138 used to maintain a value of 0 to the FSM 112$_{FSM}$ for the TMS signal while the TMS pin is thus freed to provide test data, but in circuit 124' these multiplexers are shown as multiplexers 134' and 138' and are used to maintain a value of 1 to the FSM 112$_{FSM}$ for the TRST signal while the TRST pin is thus freed to provide test data.

More specifically describing the preceding, when ATPG mode is set (i.e., ATPG=1), either the ScanEn or CMLE mode may be set, in which case the related multiplexer 134' will provide a directly tied value of 1 as the TRST signal (shown as TRST') to FSM 112$_{FSM}$. Thus, where ATPG=1 and CMLE=1, then ScanEn=0 and multiplexer 138 connects a relatively high voltage (e.g., $V_{CC}$), corresponding to a digital value of one, from input 138'$_1$ to input 134'$_0$, and multiplexer 134' passes that value to input 132'$_1$ of multiplexer 132', which connects the high voltage (i.e., one) to FSM 112$_{FSM}$, thereby not resetting the FSM. At the same time, multiplexer 140 connects the TRST data at its input 140$_1$ to input 136$_0$ of multiplexer 136, and that multiplexer 136 passes that data through to scan circuit 122. Or, where ATPG=1 and ScanEn=1, then CMLE=0 and multiplexer 134' connects a relatively high voltage from input 134'$_1$ to input 132'$_1$ of multiplexer 132', which connects the high voltage (i.e., one) to FSM 112$_{FSM}$, thereby not resetting the FSM. At the same time, multiplexer 136 connects the TRST data at its input 136$_1$ to scan circuit 122. Given the preceding, therefore, for either ScanEn or CMLE enabled, the FSM is not reset while the TRST pin is able to provide additional test data.

Given the preceding, the preferred embodiments provide improvements in data throughput for data scan of ICs and printed circuit boards (PCBs). Specifically, the preferred embodiment IC allows the sharing of either of the TMS or TRST JTAG pins, which may be combined with other approaches to natively share various (or all) of the JTAG pins to receive either JTAG signals or test data for increasing throughput. With additional pins over and above a case where fewer of such pins are available, better test time reduction is possible. Indeed, for stuck-at or TFT testing (transitional fault testing/at-speed testing), by increasing the number of scan inputs and outputs from 8 to 9, test time saving may be realized in the range of 31% to 38%. Moreover, while the preferred embodiments have been described in connection with scan operation, alternative preferred embodiments may be implemented using the present inventive teachings to permit either the TMS or TRST pins to provide other data, such as for direct memory load executed dump (DMLED) where time consuming firmware download can be highly accelerated given an additional pin(s) for such downloading. The preferred embodiment benefits may be achieved, for example, with a relatively minimal change in design overhead (e.g., by adding a few multiplexers), with no compromise on observability or controllability of data, and without interfering with internal test architecture. Still further, testing is improved without a required change to vendor testing tools and permits debugging at any stage. Moreover, while various aspects have been described, substitutions, modifications or alterations can be made to the descriptions set forth above without departing from the inventive scope. For example, the preferred embodiments are not limited to scan, but can be used during functional operation as well, such as during functional data transfer along with JTAG interface (e.g., SPI transfer, etc.). Still other examples will be ascertainable by one skilled in the art and are not intended as limiting to the inventive scope, which instead is defined by the following claims.

The invention claimed is:

1. An integrated circuit, comprising:
   functional circuitry;
   testing circuitry, comprising a state machine operable in a plurality of different states;
   a pin for receiving a signal, wherein the state machine is operable to transition between states in response to a change in level of the signal;
   circuitry for coupling the signal, in a first level, from the pin to the state machine in a first time period for causing the state machine to enter a predetermined state;
   circuitry for maintaining the signal in the first level to the state machine in a second time period for maintaining the state machine in the predetermined state; and
   circuitry for coupling data received at the pin, during the second time period, to a destination circuit other than the state machine, wherein the destination circuit is operable to perform plural successive scan tests using data from the pin without a power on reset of the functional circuitry.

2. The integrated circuit of claim 1 wherein the pin for receiving a signal comprises a pin for receiving a JTAG TMS pin.

3. The integrated circuit of claim 1 wherein the pin for receiving a signal comprises a pin for receiving a JTAG TRST pin.

4. The integrated circuit of claim 1 wherein, during the second time period, the data at the pin comprises test data.

5. The integrated circuit of claim 4 and further comprising a scan chain comprising a plurality of registers, wherein each register in the plurality of registers is connected to a respective pin on the integrated circuit, and wherein during the second time period the destination comprises testing circuitry other than the scan chain.

6. The integrated circuit of claim 1 wherein each scan in the plural successive scan tests is selected from a group consisting of PBIST, DC Parametric Tests, Flash Test, eFuse Test, and Boundary Scan Test.

7. The integrated circuit of claim 1 wherein the circuitry for coupling the signal and the circuitry for maintaining the signal are responsive to a scan enable signal.

8. The integrated circuit of claim 1 wherein the circuitry for coupling the signal and the circuitry for maintaining the signal are responsive to Channel Mask Load Enable signal.

9. The integrated circuit of claim 1 wherein the circuitry for coupling the signal and the circuitry for maintaining the signal are responsive to a scan enable signal and to a Channel Mask Load Enable signal.

10. The integrated circuit of claim 1 wherein the pin comprises one pin in a total number of pins for the integrated circuit not exceeding 8 pins.

11. The integrated circuit of claim 1 wherein the pin comprises one pin in a total number of pins for the integrated circuit not exceeding 16 pins.

12. The integrated circuit of claim 1 wherein the pin comprises one pin in a total number of pins for the integrated circuit not exceeding 32 pins.

13. The integrated circuit of claim 1 wherein the pin comprises a first pin, and further comprising a second pin for receiving a JTAG signal, the second pin shared between JTAG signaling and test data.

14. The integrated circuit of claim 1 wherein the pin comprises a first pin, and further comprising a plurality of additional pins, wherein each pin in the plurality of pins is for receiving a respective JTAG signal and is shared between JTAG signaling and test data.

15. The integrated circuit of claim 1 wherein the state machine comprises a JTAG state machine.

16. A method of operating an integrated circuit comprising functional circuitry and testing circuitry, the testing circuitry comprising a state machine operable in a plurality of different states, the method comprising:
   receiving a signal at a pin, wherein the state machine is operable to transition between states in response to a change in level of the signal;
   coupling the signal, in a first level, from the pin to the state machine in a first time period for causing the state machine to enter a predetermined state;
   maintaining the signal in the first level to the state machine in a second time period for maintaining the state machine in the predetermined state; and
   coupling data received at the pin, during the second time period, to a destination circuit other than the state machine, wherein the destination circuit is operable to perform plural successive scan tests using data from the pin without a power on reset of the functional circuitry.

17. The method of claim 16 wherein the pin comprises a pin for receiving a JTAG TMS pin.

18. The method of claim 16 wherein the pin comprises a pin for receiving a JTAG TRST pin.

19. The method of claim 16 wherein, during the second time period, the data at the pin comprises test data.

20. The method of claim 16 wherein the step of coupling the signal and the step of maintaining the signal are responsive to at least one of a scan enable signal and to a Channel Mask Load Enable signal.

* * * * *